United States Patent [19]

Husted

[11] Patent Number: 4,979,073
[45] Date of Patent: Dec. 18, 1990

[54] LOW FRICTION INSERTION STRUCTURE AND METHOD OF MAKING

[75] Inventor: Martin D. Husted, Van Nuys, Calif.

[73] Assignee: International Electrical Research Corp., Burbank, Calif.

[21] Appl. No.: 188,222

[22] Filed: Apr. 29, 1988

[51] Int. Cl.⁵ .............................................. H05K 7/20
[52] U.S. Cl. .................................. 361/386; 211/41; 361/415
[58] Field of Search ................... 211/41, 89; 361/386–389, 415; 403/374

[56] References Cited

U.S. PATENT DOCUMENTS

| | | | |
|---|---|---|---|
| 3,665,370 | 5/1972 | Hartmann | 339/176 MP |
| 3,975,805 | 8/1976 | Spurling et al. | 361/415 |
| 3,982,807 | 9/1976 | Anhalt | 339/75 MF |
| 4,298,904 | 11/1981 | Koenig | 361/386 |
| 4,502,601 | 3/1985 | Husted et al. | 361/415 |
| 4,701,829 | 10/1987 | Bricaud et al. | 361/386 |

*Primary Examiner*—Gregory D. Thompson

[57] ABSTRACT

A container in which are integral guides for slideably accepting opposite side edges of a sheet of material such as an electronic circuit board makes use of oppositely disposed cold walls in each of which are slots for reception of edges of the circuit boards. In each slot is a rotating camming bar for firmly fastening the corresponding edge of the board in good heat conducting relationship with the cold wall. Each cold wall features a single integral panel of metal having an inside face in which slots are aligned in parallel relationship. Each slot is formed by three successive passes of milling cutters, namely, a first cutter forming an initial channel of rectangular cross-sectional shape, followed by a second cutter productive of an arcuately recessed pocket in one wall of the initial channel. Thereafter a third cutter, when driven through the initial channel, is productive of an auxiliary T-shaped groove in the bottom wall of the initial channel. The auxiliary groove is cut at depth leaving a portion of original panel material between the crossbar of the T-shaped groove and the exterior surface of the panel. The T-shaped groove is for reception of a retention spring. The exterior surface of the panel may include preformed auxiliary heat dissipating fins.

13 Claims, 3 Drawing Sheets

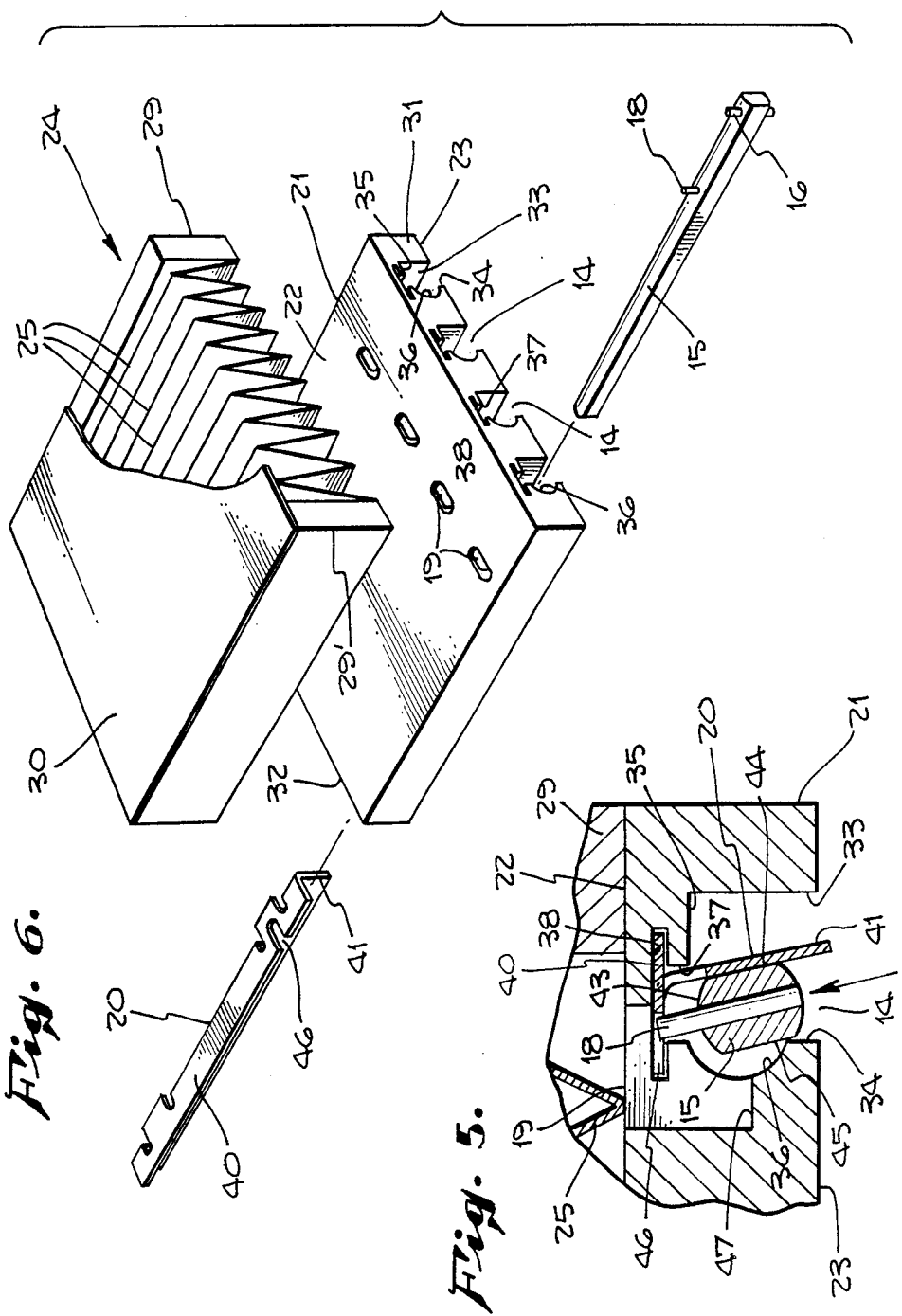

LOW FRICTION INSERTION STRUCTURE AND METHOD OF MAKING

In order to meet a variety of specifications with respect to size and capacity it has become desirable to construct material for the housing of circuit boards in a semi-finished condition. By stocking the material in that form, orders for finished containers made to varied specifications can be more effectively filled and delivered. The special character of such material does, however, require special treatment.

This is an improvement on U.S. Pat. Nos. 4,502,601 and 3,975,805.

The low friction insertion force retainer here under consideration is predominantly used as a mounting for a battery of printed electronic circuit boards and is especially advantageous where there is need for dissipation of heat generated during operation of the circuits. Customarily the boards need to be contained within a housing, of box-like configuration, where, on opposite inside walls, retainers are mounted in pairs for retaining opposite parallel edges of the boards. Although spacing heretofore between boards has tended to be generous, there has been a progressive demand to have boards compacted in closer relationship in order to have more circuit boards effectively mounted within a single housing. Additional compacting is experienced as boards tend to be thinner, lighter and smaller which has resulted from continued improvements not only in the manufacture of boards, but also the components on the boards which are interconnected by the printed circuits.

Among demands experienced in the mounting of circuit boards, in addition to increased capacity of the housing and retainers, is the need for quickly anchoring each board in turn as it is placed in the housing in a secure manner so that, irrespective of where and how the housing might ultimately be mounted or carried, the retention of the boards will remain secure. Disturbing conditions such as vibration, moisture, variations in heat and cold and comparable physically disturbing circumstances must be guarded against in the type of retainer which is made use of.

Further still, no matter with what degree of care retainers are initially built, assembled and placed in operation, servicing problems do arise, making it necessary from time to time to remove one or more or, on some occasions, all of the circuit boards and to replace them with others. For that reason, an appreciable amount of flexibility is required so that any one or more boards can be quickly released, removed and thereafter replaced. There is furthermore always the prospect that a retainer may become defective to the extent that the clamping action can no longer be depended upon. For that reason the design of the retainer needs to be such that movable parts can readily be removed and replaced.

Another factor of appreciable consequence resides in the need for having the retainers meet a wide variety of different specifications. Specifications of the character made reference to may affect such things as the length and width of boards to be accommodated, spacing of successive slots in which boards are mounted, and the thickness of the board itself. The strength and ruggedness of the housing and the thickness of the housing wall may also be a factor.

A special consequence is the ability of the wall of the housing which retains the boards to dissipate heat generated by circuits on the boards. Specifications may differ with heat dissipating needs of a given installation.

It is therefore an object of the invention to provide a new and improved container of low friction insertion force character for retention of printed circuit boards, the operating and retaining parts of which are simple and inexpensive in character while at the same time being capable of establishing a good heat conducting relationship from which the board can be readily released when appropriate.

Another object of the invention is to provide a new and improved low friction insertion force retainer and method of making which is productive of a device of improved heat dissipating capability.

Still another object of the invention is to provide a new and improved low friction insertion force retainer and method of making productive of a decrease in the number of individual parts.

Another object still of the invention is to provide a new and improved low friction insertion force retainer and method of making which enables stock piling of semi-finished parts of the device of such character that they can be readily finished in conformance with any one of a wide variety of different specifications.

Also among the objects of the invention is to provide a new and improved insertion force retainer and method of making which enables effective stock piling of semi-finished wall members prefabricated with heat dissipating fins already in place but wherein retention slots may be readily milled to accommodate any one of a wide variety of specifications with respect to details of such things as spacing of slots and thickness of circuit boards to be accommodated, together with the size and proportions of containers for reception of a specified number of circuit boards.

Further included among the objects of the invention is to provide a new and improved low friction insertion force retainer and method of making which is of such character that for enhancing the heat dissipating character of the side walls can be effectively subassembled with unfinished side wall sheets and the resulting subassembly followed by milling of the slots to specification or, in the alternative, stored as a subassembly for completion at a later date in compliance with a purchaser's specifications.

With these and other objects in view, the invention consists of the construction, arrangement and combination of the various parts of the device, serving as an example only of one or more embodiments of the invention, whereby the objects contemplated are obtained as hereinafter disclosed in the specification and drawings and pointed out in the appended claims.

In the drawings:

FIG. 5 is a fragmentary sectional view similar to FIG. 4 but with a camming bar assembly in a different operative position.

FIG. 6 is an exploded perspective view showing parts of the container side wall structure partially broken away and with portions of one camming bar assembly.

Figure 1:
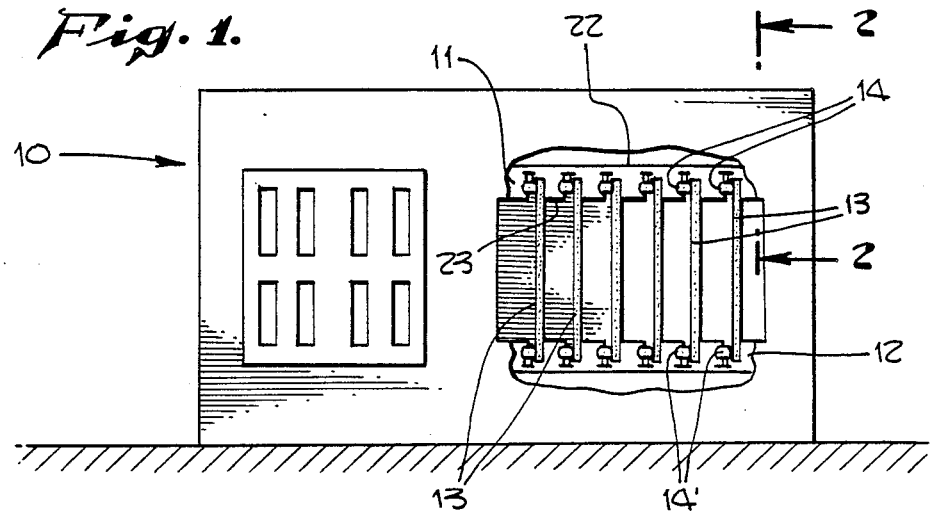
FIG. 1 is a side elevational view of a completed retainer box or container complete with circuit boards, partially broken away to show the interior.

In one embodiment of the invention chosen for the purpose of illustration, there is shown a container indicated generally by the character 10, possessed of opposite laterally spaced cold walls 11 and 12. Circuit boards 13 are shown slideably mounted and contained within composite slots 14 in the cold wall 11 and comparable composite slots 14' in the cold wall 12. The number of circuit boards 13 may vary depending upon a particular specification for a selected container 10. Spacing between the boards as mounted in the container may also vary as well as the thickness of the boards where different specifications may also need to be met. The length of the composite slots 14, 14' may also need to be varied from time to time to meet specific requirements.

Figure 2:
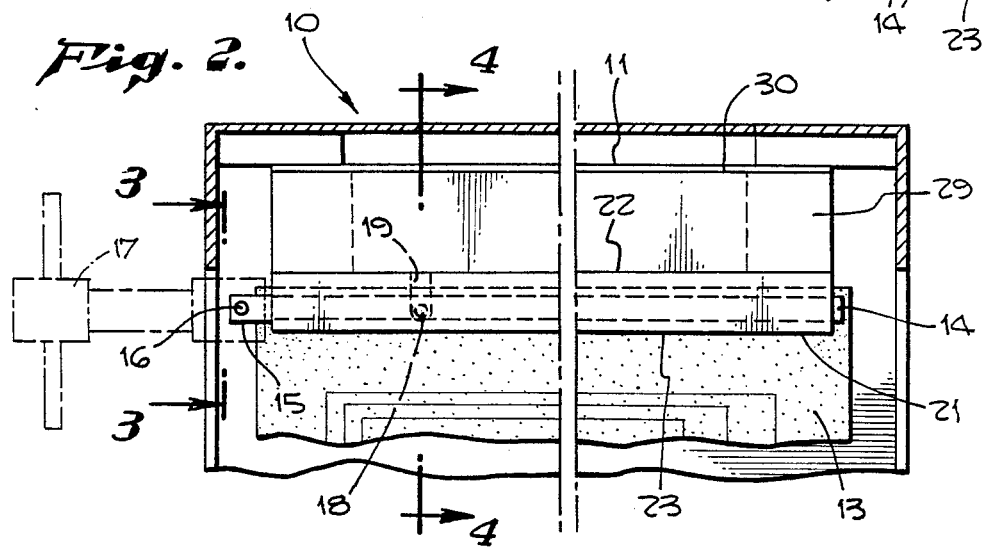
FIG. 2 is a fragmentary cross-sectional view on the line 2—2 of FIG. 1.
Figure 3:
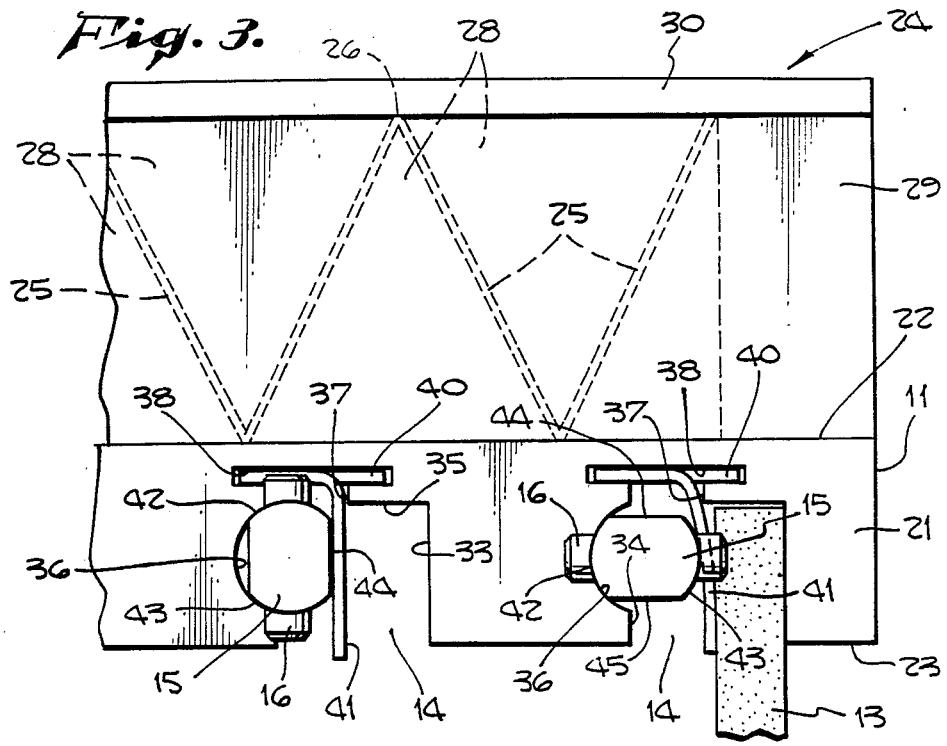
FIG. 3 is a fragmentary side elevational view of side wall structure of the container taken on the line 3—3 of FIG. 2.
Figure 4:
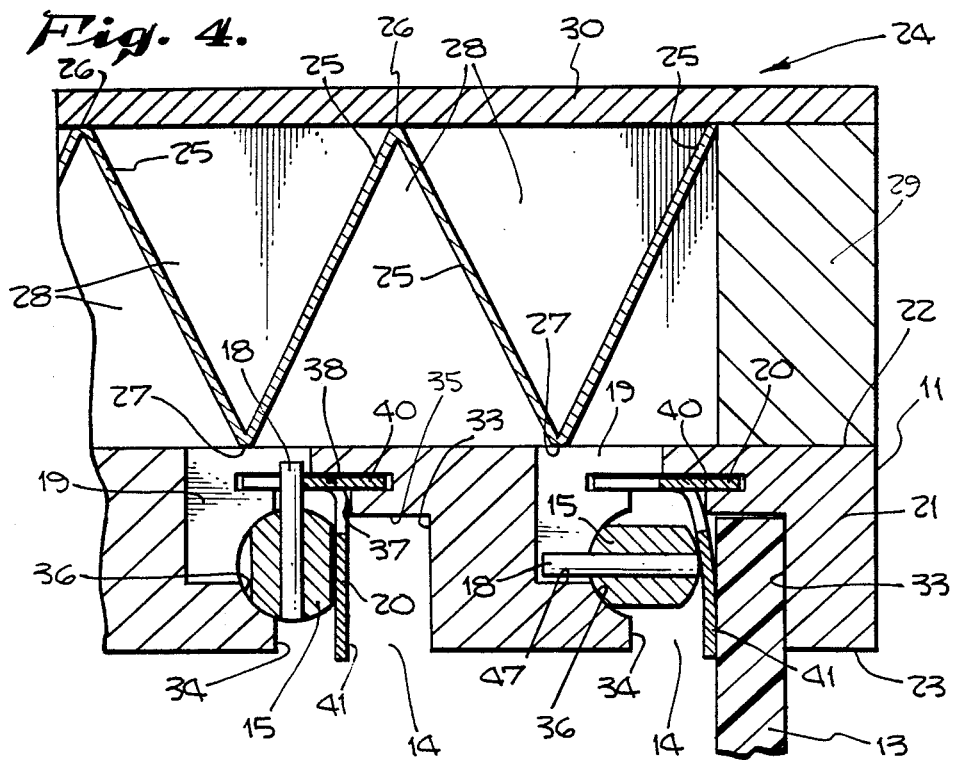
FIG. 4 is a fragmentary sectional view of a side wall structure taken on the line 4—4 of FIG. 2.

As is customary in installations of the type here under consideration, the composite slots 14, 14' are in each instance provided with a rotatably mounted rod or rod member 15 having transverse pegs 16 at the outer end adapted to be engaged by a wrench 17 shown in phantom view in FIG. 2 in order to rotate the rod between a tension position at the right of FIGS. 3 and 4 and a release position at the left of FIGS. 3 and 4. Stop pins 18 are also provided operating in notches 19 to limit the degree of rotation of the rods 15. Spring members 20 serve to hold the rods 15 in place and to be pressed against edges of the circuit boards 13 to hold them snugly in position when the rods are in the retention position as noted.

As more expressly shown in FIGS. 3, 4 and 6, the cold wall 11 or 12, as the case may be, may comprise a composite structure featuring a metal heat conducting panel 21 having an outside face 22 and an inside face 23.

Applied to the outside face 22 is a heat dissipating assembly 24. In the chosen embodiment the heat dissipating assembly consists of fins 25 which may be bent from a single sheet of appropriate heat dissipating material providing outer edges 26 and inner edges 27, the accordion folds providing air circulating channels or passages 28 intermediate the fins. To provide further support for the fins, side walls 29, 29' may be used to support a cover plate 30. The cover plate 30 may be attached to the side walls 29 and the side walls 29 similarly attached to the outside face 22 of the panel 21 by brazing or comparable anchoring technique. The structure may be additionally stiffened by brazing the outer edges 26 of the fins 25 to the inner side of the cover plate 30 and the inner edges 27 to the outer face of the heat conducting panel 21. The composite structure formed in this fashion and incorporating a conveniently oversize heat conducting panel 21 serves as a subassembly which can be stored until needed. When needed, it can be cut to an appropriate size and made ready for the forming of the composite slots 14.

In making the composite slot, the recommended procedure is to cut an initial channel into the material of the panel 21 at the inside face 23, and extending from one edge 31 to the opposite edge 32. The channel cut as by milling as described, is productive of opposite side walls 33, 34 and a bottom wall 35. The initial channel of rectangular cross-sectional shape is thus described having been cut. The next step is to cut into one of the side walls, namely, the side wall 34 of each of the channels, a semi-cylindrical arcuate pocket 36. This having been accomplished, a substantially T-shaped groove is cut into the material of the panel 21 adjacent the bottom wall 35. The T-shaped groove consists primarily of a shaft portion 37 and a crossbar portion 38, the shaft portion 37 being substantially wider than the width of the crossbar portion 38.

With the T-shaped groove having been formed as described, the succeeding step is to insert into the groove one of the T-shaped spring members 20. This is accomplished by lodging the crossbar portion 40 of the spring member 20 in the crossbar portion 38 and a portion of the shaft 41 in the shaft portion 37. By making the shaft 41 substantially longer than the depth of the side walls 33, 34, the shaft 41 will extend entirely through the composite slot and may protrude a slight distance outwardly relative to the inside face 23 of the panel 21.

As noted from the position of the spring at the left side of FIGS. 3 and 4, the shaft 41 is offset to a slight degree with respect to the center line of the crossbar portion 40 so that it is initially in a right angular relationship. In that position, the shaft may bear against the corresponding side of the shaft portion 37 of the T-shaped groove.

The rod 15 previously made reference to is formed with diametrically opposite arcuate sections 42 and 43 joined by one or more flat sections 44, 45.

By reason of the fact that the shaft 41 of the spring is of resilient consistency and the distance between opposite flat sections 44, 45 of the rod is less than the distance between the side walls 33, 34, the rod can be readily inserted laterally into position, as note FIG. 5, where the shaft 41 has been shifted far enough to permit passage. At this time the stop pin 18 on the rod is enabled to extend into an appropriate clearance slot 46 of the spring and from there into one of the matching notches 19.

Once in position, as shown in FIGS. 3 and 4, for example, when the rod is rotated to release position, portions of the arcuate sections 42, 43 will be lodged in the semi-cylindrical arcuate pocket 36. In this position a flat section 44 will contact the shaft 41 of the spring, leaving a clearance into which the edge of one of the circuit boards 13 may be received. The rod is then ready for rotation ninety degrees to the retention position at the right side of FIGS. 3 and 4. For counterclockwise rotation, the arcuate section 43 of the rod will engage the shaft 41 of the T-shaped spring and press it into engagement with the corresponding edge of the circuit board 13. At the same time the arcuate section 42 of the rod will rotate into and be retained by the semi-cylindrical arcuate pocket 36. At the same time, the stop pin 18 is enabled to swing across the corresponding notch 19 and into the notch to a position where it engages a bottom 47 of the notch, as shown in FIG. 4. Clearly reverse rotation in a clockwise direction is sufficient to shift the rod to the release position, shown on the left side of FIG. 4.

Should it become desirable to remove a rod member 15 from the position described, the shaft 41 of the spring can be depressed sufficiently to permit the rod member to be moved laterally between the shaft 41 and the adjacent side wall 34, see FIG. 5.

Figure 7:
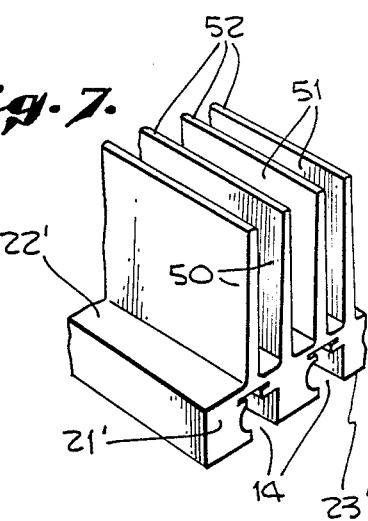
FIG. 7 is a fragmentary end perspective view showing a second form of retainer box.

In the form of invention of FIG. 7, fins 50 are formed of the material of the heat conducting panel 21', on the outside face 22'. The parallel spaced relationship of the fins provides air circulating end open channels 51 extending as do the fins in the same direction as the composite slots 14. Should it be desirable, outer edges 52 of the fins 50 could be attached to and covered by a cover plate comparable to the cover plate 30 made reference to with respect to the accordion folded fins already described.

Figure 8:
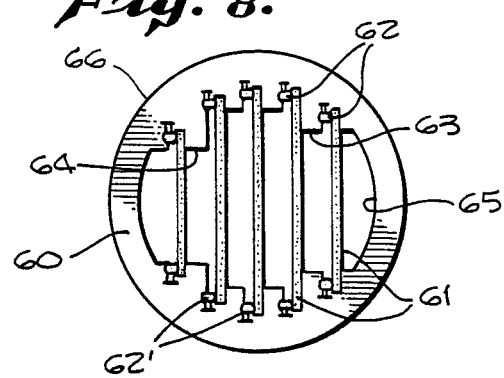
FIG. 8 is a side elevational view of a modified form of cold wall structure.

In still another form of the device as shown in FIG. 8, a cylindrical arcuate panel 60 may be employed to accommodate circuit boards 61 of various widths arranged in parallel relationship. Composite slots 62, 62' of the same type heretofore described may be cut or milled in variously positioned inside surfaces 63, 64 of a tubular interior 65. A cylindrical outside face 66 may, if desired, be provided either with the composite fins of FIGS. 3 and 4 or integrally formed fins of the type disclosed for FIG. 7. Clearly, also, the disclosure is as readily applicable to panels of other cross-sectional shape.

While particular embodiments of the present invention have been shown and described, it will be obvious to those skilled in the art that changes and modifications may be made without departing from the invention in its broader aspects and, therefore, the aims of its appended claims are to cover all such changes and modifications as fall within the true spirit and scope of this invention.

Having described the invention, what is claimed as new in support of Letters Patent is as follows:

1. A heat dissipating container for retention of sheets of material of the nature of electronic circuit boards comprising oppositely disposed cold walls of substantially homogeneous heat conducting material throughout the mass of said cold walls, each cold wall comprising a heat conducting panel having an outside face and an inside face, a plurality of spaced parallel slots on the inside face of each panel for reception of opposite edge portions of said boards, each of said slots having a substantially rectangular shape with opposite side walls, a bottom wall and an open side opposite said bottom wall, one of said side walls having a semicylindrical pocket extending throughout the length of a corresponding slot, the panel of said corresponding slot having a substantially T-shaped groove adjacent the bottom wall of said corresponding slot with a shaft portion of the T-shaped groove in communication with said corresponding slot, a crossbar portion of the T-shaped groove being located in the material of said panel between said bottom wall of said corresponding slot and said outside face of the panel, a substantially T-shaped spring member having a crossbar portion lodged in the crossbar portion of the groove and part of a shaft portion of the spring member being lodged in the shaft portion of the T-shaped groove and extending inwardly into the slot, there being a rod member rotatably mounted in each slot, said rod member having a retention position in the pocket and extending against the spring member for retention of the board, said rod member having a rotationally removed release position for said board, there being a plurality of laterally spaced heat dissipating fins extending throughout the area of the outside face of each of said cold walls.

2. A heat dissipating container as in claim 1 wherein there are longitudinally extending end open channels between said fins extending in the same direction as said slots.

3. A heat dissipating container as in claim 1 wherein said fins comprise material of said cold wall.

4. A heat dissipating container as in claim 1 wherein said fins comprise accordion-like folds of relatively thin sheet material forming channels extending in the same direction as said slots.

5. A heat dissipating container as in claim 4 wherein edges of said accordion-like folds adjacent said panel have a metal to metal attachment to the adjacent panel.

6. A heat dissipating container as in claim 4 wherein there is a cover plate over the fins on each of said panels and supporting side walls between side edges of each cover plate and adjacent side edges of the corresponding panel, side edges of said fins adjacent the cover plate having a bonded engagement with said cover plate and side edges of said fins adjacent the panel having a bonded engagement with said panel.

7. A heat dissipating container for retention of sheets of material of the nature of electronic circuit boards comprising oppositely disposed cold walls of substantially homogeneous heat conducting material throughout the mass of said cold walls, each cold wall comprising a heat conducting panel having an outside face and an inside face, a plurality of spaced parallel slots on the inside face of each panel for reception of opposite edge portions of said boards, each of said slots having a substantially rectangular shape with opposite side walls, a bottom wall and an open side opposite said bottom wall, one of said side walls having a semicylindrical pocket extending throughout the length of a corresponding slot, the panel of said corresponding slot having a substantially T-shaped groove adjacent the bottom wall of said corresponding slot with a shaft portion of the T-shaped groove in communication with said corresponding slot, a crossbar portion of the T-shaped groove being located in the material of said panel between said bottom wall of said corresponding slot and said outside face of the panel, a substantially T-shaped spring member having a crossbar portion lodged in the crossbar portion of the groove and part of a shaft portion of the spring member being lodged in the shaft portion of the T-shaped groove and extending inwardly into the slot, there being a rod member rotatably mounted in each slot, said rod member having a retention position in the pocket and extending against the spring member for retention of the board, said rod member having a rotationally removed release position for said board, said cold walls comprising arcuately extending inwardly concave cold walls and wherein distances between oppositely disposed slots vary progressively from the oppositely disposed slots at one side to the oppositely disposed slots at the other side.

8. The method of forming a heat dissipating container for retention of sheets of material of the nature of electronic circuit boards comprising oppositely disposed cold wall panels having outside and inside faces and with oppositely disposed retention slots in pairs on corresponding cold wall panels, said method comprising cutting for each retention slot an initial channel in the inside face of each of the cold wall panels extending from one side edge to the other at the location of each slot, making said channel of substantially rectangular cross-sectional shape thereby forming side walls, a bottom wall and an opening opposite said bottom wall, cutting a semicylindrical pocket in one of said side walls of the channel, cutting from material of each panel a shaft receiving portion of a substantially T-shaped groove, cutting from material of each panel a crossbar receiving portion of the T-shaped groove and forming fins on the outside face of each of the panels with passages between the fins extending in the same direction as the direction of the slots on the inside face of each of the panels.

9. The method of forming a heat dissipating container as in claim 8 including forming each of the panels in oversize sections and then cutting each of the panels to finish size followed by cutting the channels in the inside face of each of the cold wall panels wherein each of the panels are of finish size.

10. The method of forming a heat dissipating container for retention of sheets of material of the nature of electronic circuit boards comprising oppositely disposed cold wall panels having outside and inside faces and with oppositely disposed retention slots in pairs on corresponding cold wall panels, said method comprising cutting for each retention slot an initial channel in the inside face of each of the cold wall panels extending from one side edge to the other at the location of each slot, making said channel of substantially rectangular cross-sectional shape thereby forming side walls, a bottom wall and an opening opposite said bottom wall, cutting a semicylindrical pocket in one of said side walls of the channel, cutting from material of each panel a shaft receiving portion of a substantially T-shaped groove, cutting from material of each panel a crossbar receiving portion of the T-shaped groove, applying longitudinally extending parallel laterally spaced fins to the outside face of each of the panels, applying a cover sheet to the fins and supporting said cover sheet on each of the panels with supporting side walls parallel to the fins.

11. The method of forming a heat dissipating container as in claim 10 including folding a sheet of material in an accordion fold whereby to form said fins with outer and inner edges.

12. The method of forming a heat dissipating container as in claim 10 including folding a sheet of material in an accordion fold whereby to form said fins with outer and inner edges, fastening said inner edges to the outside face of the corresponding panel and fastening said outer edges to the cover sheet.

13. The method of forming a heat dissipating container as in claim 10 including forming panels in oversize sections, folding a sheet of material in an accordion fold whereby to form said fins with outer and inner edges, fastening said inner edges to the outside face of each oversize panel section and fastening said outer edges to the cover sheet, then cutting each oversize section and attached fins to finish size followed by cutting the channels in the inside face of the panels which have accompanying fins when said panels are of finish size.

* * * * *